US011041927B1

(12) United States Patent
Wheaton et al.

(10) Patent No.: US 11,041,927 B1
(45) Date of Patent: Jun. 22, 2021

(54) APPARATUS, SYSTEM AND METHOD FOR MACHINE LEARNING SPIKE NOISE DETECTION

(71) Applicant: CANON MEDICAL SYSTEMS CORPORATION, Tochigi (JP)

(72) Inventors: Andrew James Wheaton, Shaker Heights, OH (US); Anuj Sharma, Hudson, OH (US)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 0 days.

(21) Appl. No.: 15/931,078

(22) Filed: May 13, 2020

(51) Int. Cl.
| G01R 33/56 | (2006.01) |
| G06T 5/00 | (2006.01) |
| G06T 7/00 | (2017.01) |
| G06K 9/00 | (2006.01) |
| G06N 3/08 | (2006.01) |
| G06N 20/10 | (2019.01) |

(52) U.S. Cl.
CPC ......... *G01R 33/56* (2013.01); *G06K 9/00536* (2013.01); *G06N 3/08* (2013.01); *G06N 20/10* (2019.01); *G06T 5/002* (2013.01); *G06T 7/0012* (2013.01); G06T 2207/10088 (2013.01); G06T 2207/20081 (2013.01); G06T 2207/20084 (2013.01)

(58) Field of Classification Search
USPC ....................................................... 324/307
See application file for complete search history.

(56) References Cited

U.S. PATENT DOCUMENTS

| 7,868,626 B2 | 1/2011 | Yoshizawa |
| 9,971,008 B2 | 5/2018 | Thompson et al. |
| 2020/0294287 A1* | 9/2020 | Schlemper ............ G06T 7/0012 |

OTHER PUBLICATIONS

Lee, J., et al., "k-space deep learning for MR herringbone artifact correction", https://index.mirasmart.com/ISMRM2019/PDFfiles/4855.html, Proc. Intl.Soc. Mag. Reson. Med. 27 (2019).
Lecun, Y., et al., "Deep Learning", Nature, May 28, 2015, pp. 436-444, vol. 521.
Spraggins, T.A., "Spike Removal From MR Raw Data Sets", pp. 789 , 2020.
Goldfarb, J.W., et al., "A Robust Method to Remove Spike Artifacts Through HPF-Post-Processing", In: Proceedings of the 4th Annual Meeting of ISMRM, New York, New York, USA, 1996.
Chavez, S., et al., "Robust Correction of Spike Noise: Application to Diffusion Tensor Imaging", Magnetic Resonance in Medicine, 2009, pp. 510-519, vol. 62.
Campbell-Washburn, A.E., "Using the Robust Principal Component Analysis Algorithm to Remove RF Spike Artifacts from MR Images", Magnetic Resonance in Medicine, 2016, pp. 2517-2525, vol. 75.

* cited by examiner

Primary Examiner — Rodney E Fuller
(74) Attorney, Agent, or Firm — Canon U.S.A., Inc., IP Division

(57) ABSTRACT

An apparatus and method of detecting a characteristic in an image is performed by obtaining, from an image capturing apparatus, raw signal data formed from a plurality of data samples and including a signal of interest captured by the image capturing apparatus and classifying, using a neural network, samples other than the signal of interest using a classifier having been determined using a first parameter based on information about the sample and a second parameter based on information identifying a position of the sample within the raw image data.

19 Claims, 11 Drawing Sheets

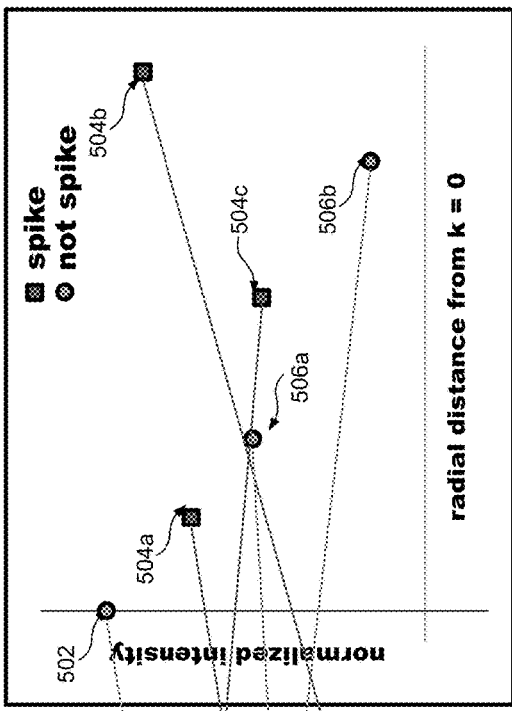
Fig. 5A
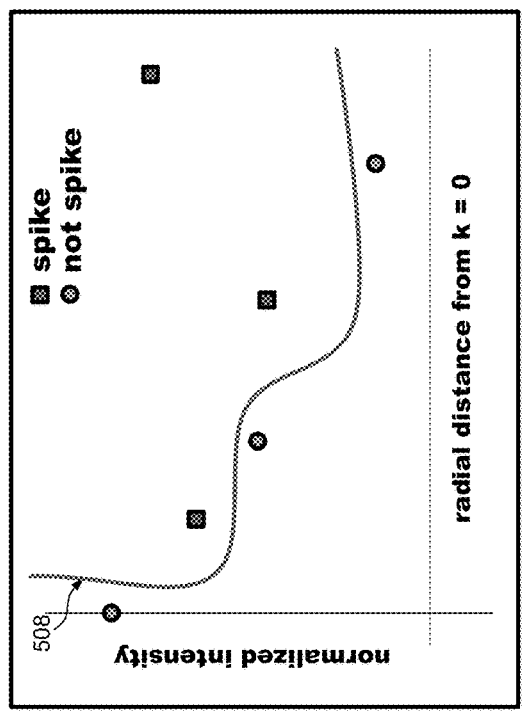
Fig. 5B

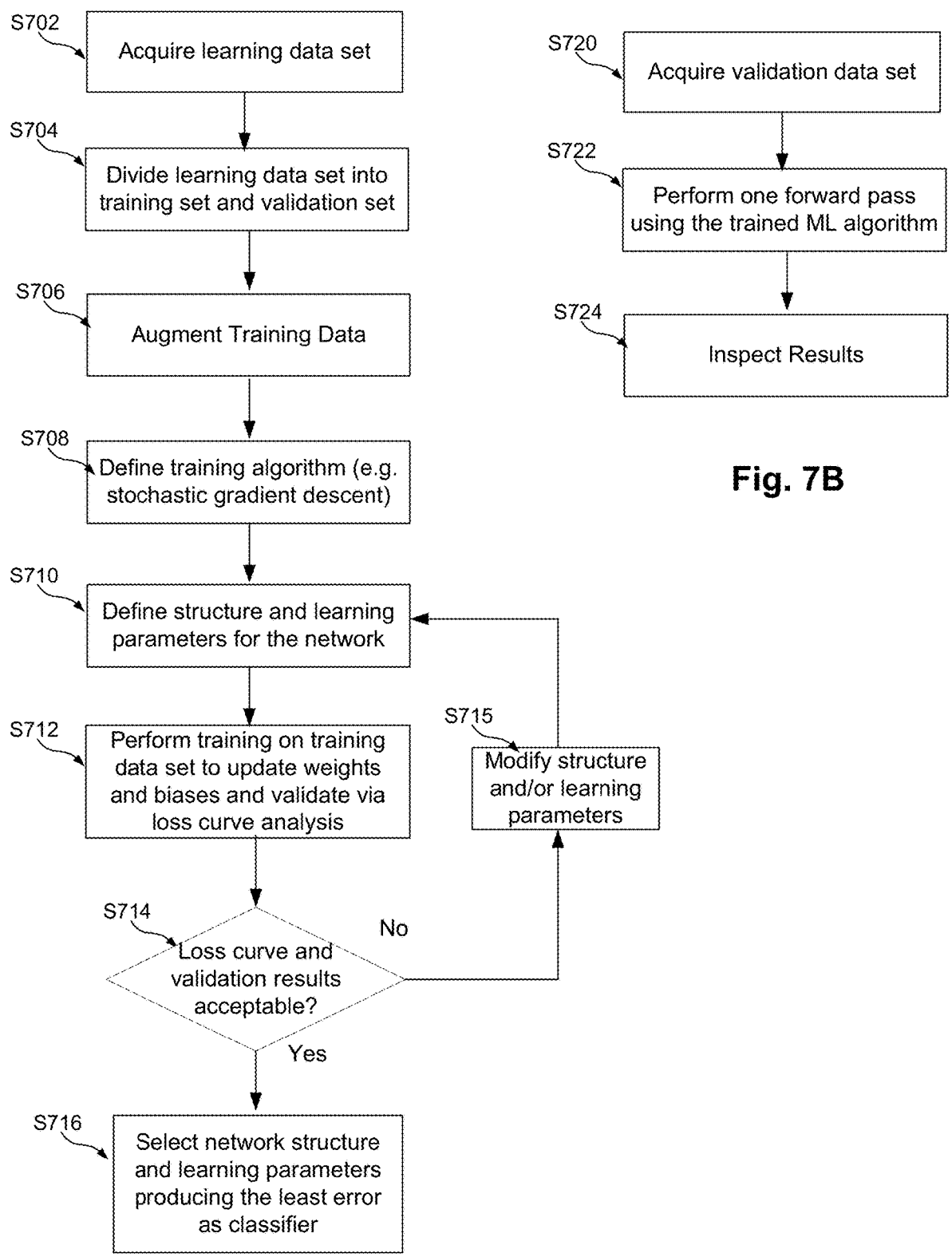

APPARATUS, SYSTEM AND METHOD FOR MACHINE LEARNING SPIKE NOISE DETECTION

BACKGROUND

Field of Art

The present disclosure relates to image processing techniques. More specifically, the disclosure exemplifies techniques for detecting spike noise in images captured using a magnetic resonance imaging (MRI) scan method.

Description of the Related Art

Magnetic Resonance Imaging makes use of magnetic fields and radio frequency waves to generate cross-sectional images of a patient positioned therein. In doing so, there are a plurality of different MR scan types that can be used in generating patient image data. These scan sequences include, but are not limited to, EPI scans, FE scans and/or FSE scans. During the scan sequence, the MR scanner captures raw MR data generated when a magnetic field is applied to a target area at a particular frequency. This causes excited protons to emit an RF signal that is measured by one or more detectors. Positional information may also be generated and captured by the one or more detectors using gradient coils to vary the magnetic field being applied to the patient. At the conclusion of each scan sequence, the raw MR data is captured. However, the raw MR data may not only include a target signal of interest as per the setting used during the MR scan sequence. Instead, the raw MR data may also include noise that results from one or more operations of the MR scanner during a scan sequence. The inclusion of noise within the raw MR data negatively impacts the resulting image (e.g. the diagnostic image) generated from the raw MR data. One common type of noise is known as spike noise. This is also referred to as popcorn or burst noise. While noise removal algorithms are known, it is difficult for these algorithms to be successfully deployed due to the nature of spike noise. Spike noise is caused when static charge builds up in the various metallic components that make up the MR scanner due in large part to the high switching frequency of the readout gradients. The static charge may result in a current being generated and which presents itself in the captured raw MR data. While the cause of such spike noise is known, the frequency at which spikes appear and the position of the spike within the raw MR data is not predictable and appears at random. Because of this random occurrence and position of spike noise, the result in the diagnostic image is manifested as ripples. These cause severe artifacts in the diagnostic image which negatively impact clinicians who are charged with reading these images and providing patient care. A system and method as discussed below resolves these drawbacks by predictably identifying spike noise in raw MR data despite the fact that the occurrence of these spikes is non-uniform.

SUMMARY

According to an embodiment of the present disclosure, an image processing apparatus is provided. The image processing apparatus includes one or more memories storing instructions and one or more processors configured to execute the stored instructions. Upon execution, the one or more processors are configured to obtain k-space data of an object, acquired by an MRI scanner, including multiple data samples, wherein each data sample of the multiple data samples includes an intensity value, calculated, for each of the multiple data samples, a distance value from an origin of the k-space data of the object, and perform a classification of whether a data sample of the multiple data samples represents spike noise, based on the intensity value and the calculated distance value of the data sample.

In other embodiments, methods for performing the image processing operations described above are also contemplated.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

Further objects, features and advantages of the present disclosure will become apparent from the following detailed description when taken in conjunction with the accompanying figures showing illustrative embodiments of the present disclosure.

FIGS. 5A & 5B are graphical visualization of an algorithm according to an embodiment.

FIGS. 7A & 7B are flow diagrams of an algorithm according to an embodiment.

Figure 1:
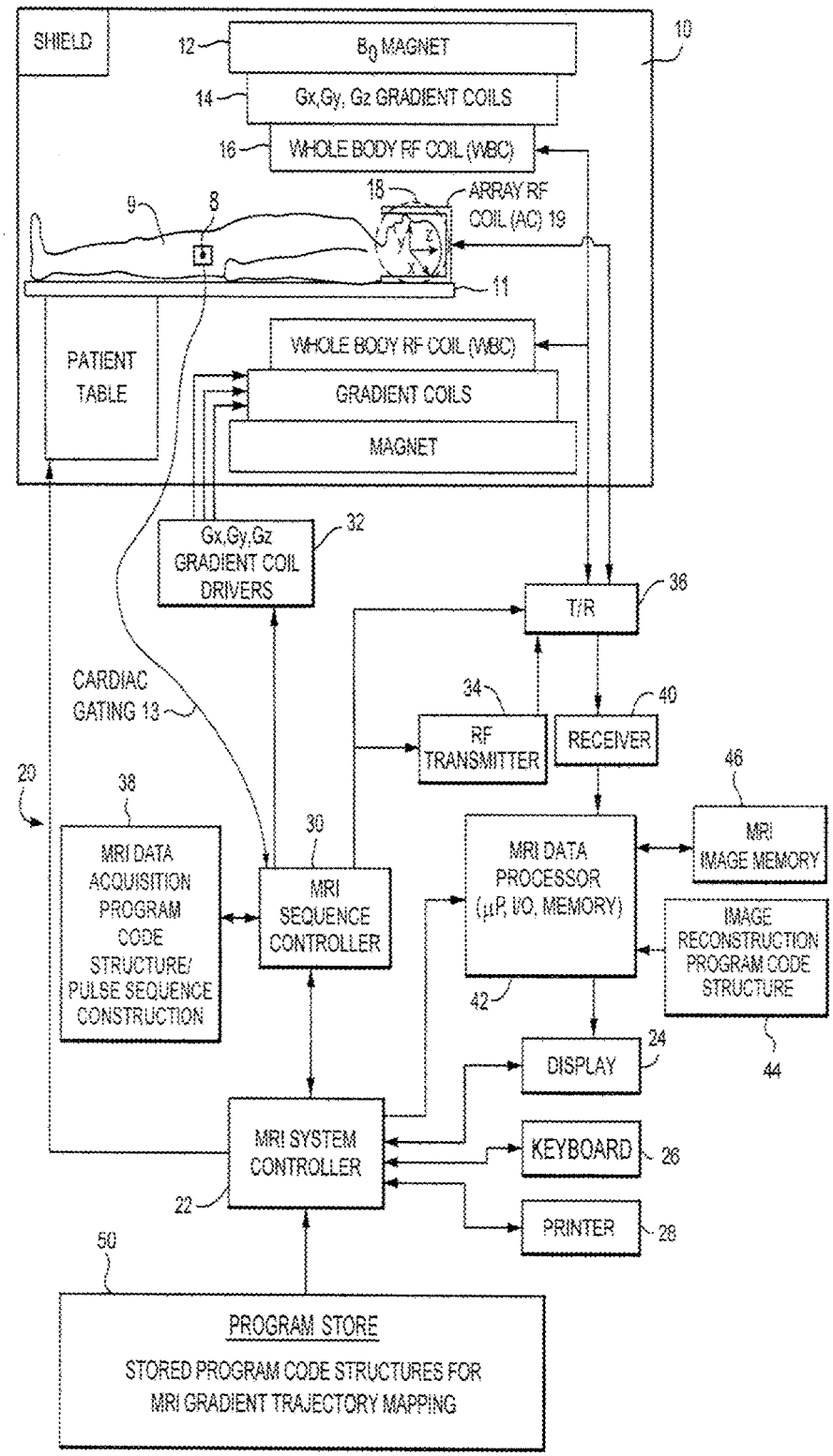
FIG. 1 is a block diagram of an MR scanner.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

According to the present disclosure a noise detection system and method that detects spike noise within raw data (hereinafter "k-space data") captured by an MR scanner is provided. The system and method use at least one classifier generated by at least one machine learning algorithm. The classifier is used to identify, within the k-space data, a region of one or more samples that is corrupted by spike noise. However, it should be understood that spike noise may also include any noise that is anomalous, transient and which appears at random and includes a high intensity value. The noise is unpredictably caused by one or more components of the MR scanner during operation thereof. The classifier that discriminates each sample within the k-space data as "noise" or "not noise" is generated based on at least two parameters associated with the k-space data. As used herein, classification of a sample as "noise" indicates that spike noise is present at the particular sample. Moreover, classification of a sample as "not noise" indicates that the sample does not includes spike noise. In other words, a sample classified as "not noise" may be a sample having signal data (e.g. part of a signal of interest) or not having signal data. Alternatively, a sample classified as "not noise" may contain noise that is not spike noise. In certain embodiments, the classification of samples may include a third classification indicating that the sample is something other than "noise" or "not noise". The first parameter is a location of the sample within k-space data and the second parameter is an intensity value (normalized or not normalized) of the sample within k-space data. In this manner, spike noise detection is improved. Spike noise is advantageously identified and corrected prior to transforming the k-space data into the image domain when generating the diagnostic image. This advantageously improves the resulting diagnostic image because ripples and other artifacts that result when spike noise in k-space is processed into the diagnostic image are removed.

An exemplary MRI system configured to capture k-space image data from a target (e.g. patient) in order to generate a diagnostic image is shown in FIG. 1. The MRI system includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field Bo magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. As will be understood, for some purposes a phantom object instead of human anatomy may be positioned at a desired location in the imaging volume 18. One or more smaller array RF coils 19 might be more closely coupled to the patient head in imaging volume 18. As those in the art will appreciate, compared to the WBC (whole body coil) 16, relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume. A cardiac signal acquisition apparatus 8 (positioned as appropriate on the patient anatomy) may be used to provide peripheral pulsatile and/or cardiac gating signals 13 to trigger the MRI sequence controller 30.

An MRI system controller 22 has input/output ports connected to a display 24, keyboard 26 and printer 28. As will be appreciated, the display 24 may be of the touch-screen variety so that it provides control inputs as well and a mouse or other I/O device(s) may be provided. The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR imaging) techniques, which may also include parallel imaging. As described below, sequence controller 30 may be configured to apply predetermined pulse sequences and/or pulse sequences formed in accordance with configuration parameters, in order to obtain NMR echo data ("echo data") from which a diagnostic MRI image is obtained. MRI sequence controller 30 may also be configured for echo planar (EPI) imaging and/or parallel imaging. Moreover, MRI sequence controller 30 may facilitate one or more preparation scan (prescan) sequences, and a scan sequence to obtain a main scan MR image (sometimes referred to as the diagnostic image). The MRI system controller 22 and the MRI sequence controller 30 include one or more processors and one or more memories that store instructions and execute those instructions which cause the MR scanner to perform the operations described herein.

The MRI system components 20 include an RF receiver 40 providing input to MRI data processor 42 so as to create processed image data, which is sent to display 24. The MRI data processor 42 is also configured for access to previously generated MR data, images, and/or maps, and/or system configuration parameters 46, and MRI image reconstruction/subtraction program code structures 44 and 50. In other embodiments, the processed image data may be transmitted to remote servers for later access by one or more computing devices. This may include, for example access by a personal computer, laptop, tablet, smartphone or other portable computing device that includes a display (integral thereto or connected thereto).

Also illustrated in FIG. 1 is a generalized depiction of an MRI system program store 50 where stored program code structures (e.g., spike noise detection, for image reconstruction, for post-processing MRI, etc.) are stored in a non-transitory computer-readable storage media accessible to the various data processing components of the MRI system. The program store 50 may comprise one or more memory devices that store program code structures which embody a set of instructions that are executable by one or more processing units including but not limited to the MRI system controller 22, MRI sequence controller 30 and/or MRI data processor 42. Program code may also be stored for obtaining operator input, including, for example, pulse sequence configurations including refocusing flip angle configurations for refocusing pulses in pulse sequences such as fast acquisition spin echo (FASE), TR interval settings, etc. As those in the art will appreciate, the program store 50 may be segmented and directly connected, at least in part, to different ones of the MRI system components 20 processing computers having most immediate need for such stored program code structures in their normal operation (i.e., rather than being commonly stored and connected directly to the MRI system controller 22). It should also be understood that the program code stored therein may incorporate a set of instructions that are executable by one or more processing devices (e.g. CPUs, GPUs, etc.) and, upon execution thereof, configure the one or more processing devices to perform the operations embodied in the set of instructions.

Indeed, as those in the art will appreciate, the FIG. 1 depiction is a very high-level simplified diagram of a typical MRI system with some modifications so as to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles). Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes the generation of a subtracted image from control and tagging images, as described below, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system components 20, causes a particular sequence of operational states to occur and be transitioned through within the MRI system. As such, the description that follows may refer to any of the processing components described hereinabove with respect to FIG. 1 as one or more processors which execute instructions stored in one or more memory devices.

Figure 2A:
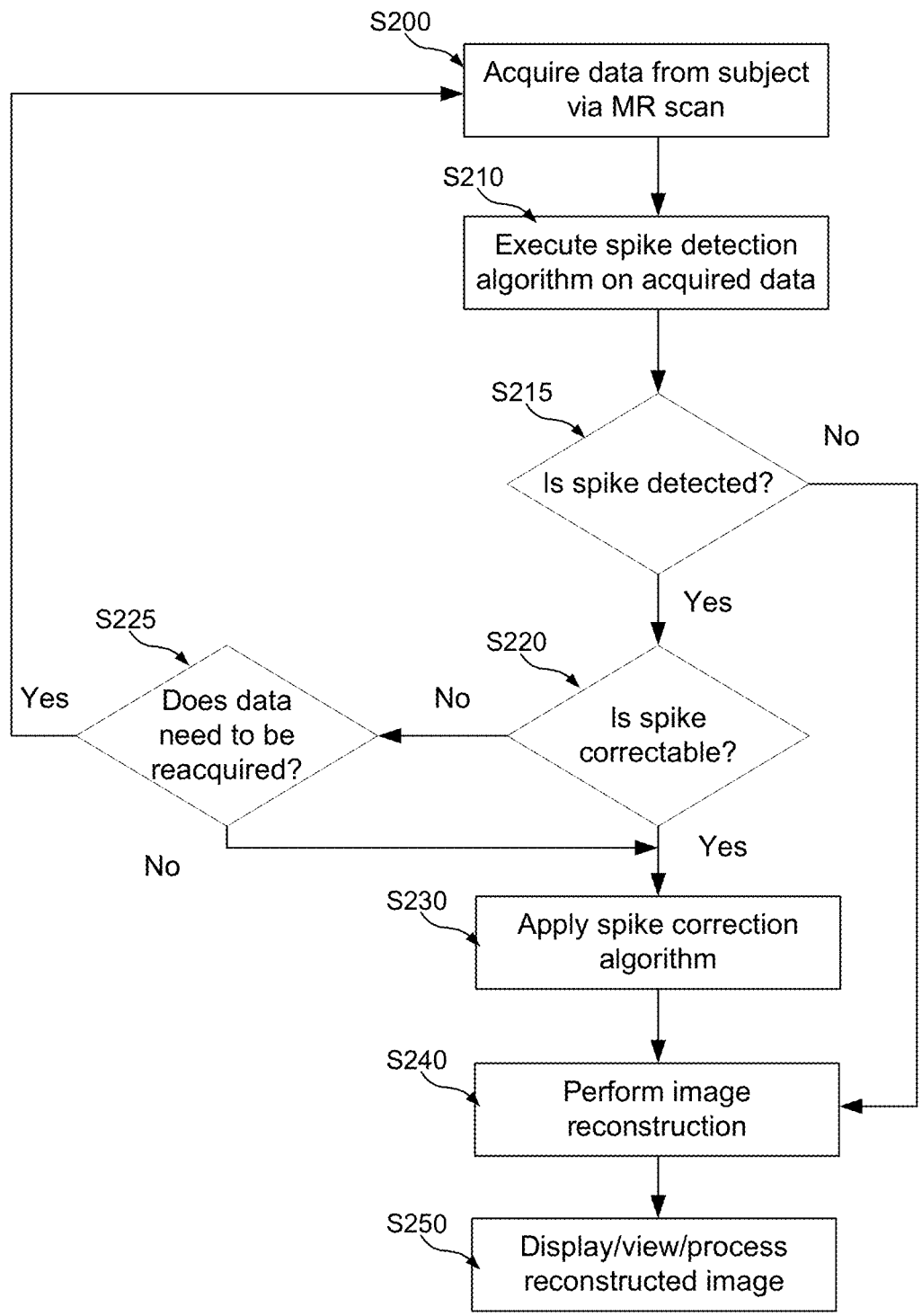
FIGS. 2A-2D is a flow diagram of an algorithm according to an embodiment.

FIG. 2A illustrates an operation algorithm performed by the MRI system described in FIG. 1. More specifically, the algorithm described herein may be performed by the MRI data processor 42 in FIG. 1. The MRI data processor 42 may have instructions stored in a memory therein and when executed perform the described algorithm. In other embodiments, the MRI data processor 42 may be in communication with a remote computing system such as a server, either on a local area network or disposed in the cloud. The remote server may include one or more processors which operate as processing circuits which execute one or more sets of instructions stored in one or more memory devices that would enable the server to execute the algorithm illustrated in FIG. 2A.

Figure 2B:
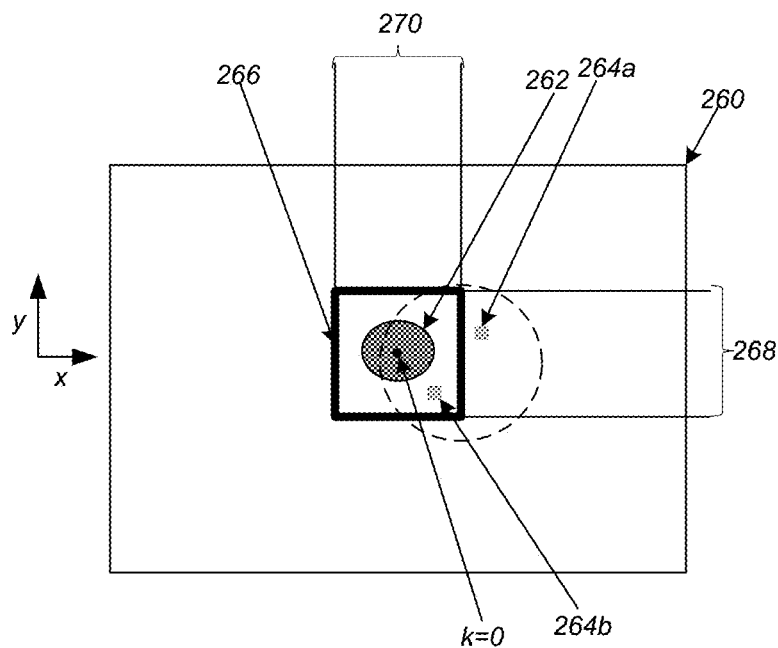
Figure 2C:
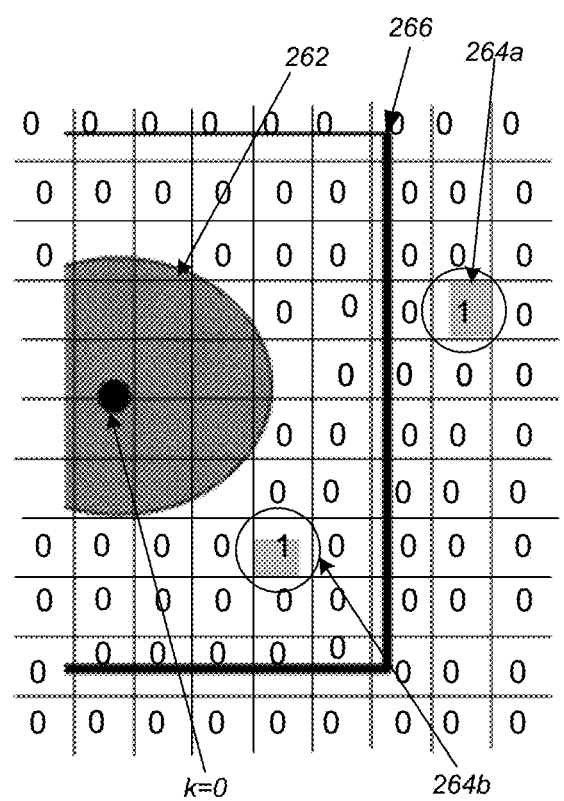

The algorithm shown in FIG. 2A will be described herein below and at times will reference FIGS. 2B and 2C. This illustrates various data objects that are acted upon during execution of the algorithm in FIG. 2A. As such, FIGS. 2B and 2C are intended to further facilitate understanding of the algorithmic processing described herein. This algorithm, when executed, results in the MRI system capturing data representative of at least a section of a patient. The captured data is analyzed and processed to generate a diagnostic image for use in improving patient care. In step 200 an MRI scan sequence is initiated and a target portion of a patient is scanned in the exemplary manner discussed above in FIG. 1. The result of this scan is a data acquisition step whereby MR data in the Fourier domain is acquired. The acquired data includes a plurality of samples of k-space for the particular sequence. The k-space data includes the spatial frequency of the image and is referred to as being the time domain data because it is based on an electrical signal that is sampled in time. This can also be referenced as the k-space domain or spatial frequency domain. The k-space data can then be transformed via a Fourier Transform into the image domain (also known as the spatial domain). Exemplary k-space data is illustrated in in FIG. 2B denoted by reference numeral 260. In one embodiment, the scan sequence is an echo planar imaging (EPI) scan whereby the entire plane, including all lines, of the k-space data are acquired at a same time (e.g. during a single burst). In one example, the burst of the EPI scan can acquire 80 or more lines that cover the complete set of k-space. This manner of capturing, including lines included in the burst scan are for illustrative purposes only to represent that a plurality of lines is simultaneously acquired. Additionally, the discussion of an EPI scan sequence is merely exemplary and other scan sequences can similarly be used. The data acquired herein can be 2D planar slice data representing a single slice amongst a plurality of slices of MR data of the patient. Further, while the description of this data references the 2D MR data, it should be noted that 3D volumetric data can also be acquired. As such, the operations of the spike detection algorithm described herein can be applied to either 2D planar data or 3D volumetric data acquired by the MR scanner in step S200. The k-space data 260 in FIG. 2B is an example of 2D planar k-space data.

The exemplary 2D k-space data 260 shown in FIG. 2B is comprised of a plurality of individual k-space samples. The k-space data 260 can be thought of as a grid along x and y axes as indicated in FIG. 2B. In an embodiment where the k-space data 260 is 3D k-space data, the individual samples can also be positioned along a z-axis. For example, exemplary 2D k-space data 260 may be an array that is 64 samples by 64 samples, 128 samples by 128 samples or 256 samples by 256 samples. The size of this array depends on the parameters set during the data acquisition phase. Each individual k-space sample has position information associated therewith such that each k-space sample can be identified by $(k_x, k_y)$, where x is the position of the sample along the x-axis and y is the position of the sample on the y-axis. This is known as k-location information. The k-location information is understood relative to particular designated position representing an origin point within k-space. The particular designated position is labeled k=0 in FIG. 2B and is set during the MR scan acquisition phase in step S200. In certain instances, k=0 may be referred to as the center of k-space. Position k=0 indicates the substantial center point around which the signal of interest is located. The signal of interest is denoted within the circle labeled with reference number 262. The signal of interest 262 includes one or more k-space samples at and around the designated position of k=0 and represents a region within k-space data 260. Thus, a k-location value for a particular sample indicates the particular samples position on the x and y axes relative to k=0. Generally, the samples that represent the signal of interest have the highest signal intensity values as compared to all other k-space samples and are within a predetermined k-space sample distance from k=0. Moreover, the k-space samples are used by the image reconstruction algorithm to transform the k-space data into image domain data. This transformation results in generation an image of the subject and can be used for medical diagnostic purposes. The other features illustrated in FIG. 2B will be described hereinafter as necessitated by the algorithmic processing.

In step S210 and continuing with elements shown in FIG. 2, the MRI system of FIG. 1 executes a spike detection algorithm to analyze the k-space data acquired in step S200. Step S210 determines whether spike noise is present and determines the location of the spike noise relative to the signal of interest 262. The algorithm analyzes each sample included in the acquired k-space data 260 to determine whether the particular sample is corrupted by spike noise. In other words, the entirety of the k-space data 260 acquired in step S200 and each of the plurality of individual k-space samples are analyzed by the algorithm to identify whether that particular sample should be identified as "spike noise" or "non-spike noise". The spike detection algorithm will be described hereinafter in more detail. The spike detection algorithm may be embodied as a discrete set of instructions executed by one or more processors such as element 42 in FIG. 1. Alternatively, the spike detection algorithm may be a sub-routine of a larger data acquisition and diagnostic image generation algorithm executed by the MRI system. In another embodiment, the spike detection algorithm may be a set of instructions stored in a memory of an external computing device such as a server or the like (see FIG. 8) such that the acquired k-space data is provided to the external computing device which executes the instructions stored in the memory of the external computing device to perform the spike detection processing described herein.

The spike detection algorithm makes use of a model trained by a machine learning algorithm which performs a classification on the received k-space data samples to classify one or more k-space data samples as at least one of noise or not noise. In certain embodiments, the classification performed is binary. In certain other embodiments, the classification performed is not binary and can include a single classification or more than two types of classification outputs. As will be described herein, the classification performed is a binary classification but other types of classifications are possible as noted above. The binary classification determines whether the sample is representative of spike noise or not. The spike detection algorithm provides the received k-space data to the trained model in order to perform a binary classification. The binary classification is performed on each sample in k-space using a classifier that uses at least two parameters or features to determine the presence or absence of spike noise. The manner in which classification using the trained model will be discussed in greater detail with respect to FIGS. 3A & 3B and FIG. 4. The result of the binary classification is a value attributable to each sample where "0" indicates that the sample is not spike noise and "1" indicates that the particular sample is spike noise. In one embodiment, the trained model accepts, as input for each k-space sample, values for each of the at least two parameters. The input values are used by the trained machine learning algorithm to determine the classification of that particular k-space sample. In another embodiment, the trained model accepts as a vector the entire k-space data and including information associated with each of the k-space samples in the acquired k-space data. The information associated with each of k-space samples in the vector can be any information that may be used to determine or otherwise extract one or more features describing either the k-space sample or the vector of k-space data. This may be usable in a determination as to whether k-space samples are spike noise or not spike noise. In this embodiment, the model will have been trained via a machine learning algorithm which analyzed a set of training data comprising k-space vectors. This embodiment may use any information contained in the k-space vector to identify at least two parameters. The identified at least two parameters can be used to determine the classification of individual k-space samples. In one embodiment, one parameter on which the classification is made is a value representing a location of the sample within k-space relative to a designated position (k=0) in the k-space. Furthermore, the designated position k=0 is a known position as it is set as part of the data acquisition processing. Thus, the signal of interest 262 is localized in k-space 260 around k=0 and extends outward from that position. A further parameter is a signal intensity value (normalized or non-normalized) for the particular sample.

As noted above, depending on the type of trained model, at least these parameter values for each sample may be input or may be derived based on an input vector representing a complete set of k-space data that has been acquired. In another embodiment, a further parameter that may be considered and used as part of the trained model are MR scan parameters that are set by an operator during the data acquisition phase.

Exemplary spike detection using binary classification performed at step S210 can be visualized when looking at FIG. 2B. As previously noted, the k-space data 260 includes the designated position k=0 and the region containing the signal of interest 262 that surrounds k=0. Also illustrated within k-space data are samples 264a and 264b. Each of these samples has its own k-location value relative to k=0. Each of these samples also have an associated intensity value that is higher than intensity values of samples immediately adjacent thereto. The k-location values of each of samples 264a and 264b indicate that they are outside of the signal of interest region 262. As such, when the k-space data 260 is input into the trained model, the classifier therein bases its classification of the samples on these two parameter values (intensity value and k-location relative to k=0). As shown herein, the classifier has determined that samples 264a and 264b may be indicative of samples corrupted by spike noise. FIG. 2B is meant for purposes of example and all other samples not discussed may be considered to have been classified as "not spike noise".

In the above described exemplary embodiments the MRI scan in the step S200 and the spike detection in the step S210 are performed sequentially In another exemplary embodiment at least a part of the MRI scan and at least a part of the spike detection are performed in parallel. If the k-space data acquisition is performed in a radial scan mode, for example, the spike detection is performed right after a scan of one spoke extending from the center of the k-space in a certain angular direction. This occurs while the next one or more scans of the neighboring spokes is (are) being performed. Performing spike detection in parallel to the MRI scan as described above reduces the total processing time from MRI scan to displaying the reconstructed image. The system can also perform certain pre-processing for the acquired raw k-space data for the spoke after the raw k-space data acquisition and before the spike detection.

Thereafter, the spike detection algorithm causes a map of k-space data 260 to be dynamically generated. The map represents each sample within the k-space data that was acquired. The map further shows the result of the classification performed on each sample. An example of the map is illustrated in FIG. 2C. FIG. 2C shows an enlarged portion of k-space data 260 located within the dotted circle of FIG. 2B. The generated map represents a grid where each cell of the grid represents a single sample of k-space data that has been acquired and classified. From this dynamically generated map, the classification value in each cell provides the location within the k-space data indicating the presence (or absence) of spike noise. In this example, samples 264a and 264b have been determined by the classifier to have a sufficient intensity value and k-location distance from k=0 that is sufficiently outside the region containing the signal of interest 262. The algorithm generates the map and labels samples outside the region of interest that were classified as "not spike noise" as "0". The algorithm further labels samples 264a and 264b, which were classified as spike noise, as "1". The map generated herein may be stored as a grid or matrix. The stored map includes an origin representing the designated position (k=0) from which individual samples can be positioned at positive or negative positions along 1, 2 or 3 axes. In the exemplary case described herein, the k-space data is a 2D plane of k-space. Thus, the position information associated with each sample can be represented along x and y axes as ($k_x$, $k_y$). Also, part of the dynamic map generation is the determination which of the one or more samples (e.g. set of samples) that constitute the region comprising the signal of interest 262. This determination is based on the known position set as part of the MR data acquisition step. Within the region containing the signal of interest 262, k=0 represents the sample having the highest signal intensity value within k-space. It is likely that other samples adjacent to and/or within the vicinity of the k=0 would also include information of interest that will be used to reconstruct a diagnostic image. However, there is only a single point in k-space designated as k=0 by the algorithm. The single point is understood to be the origin of k-space. The map may be stored, as a matrix or other appropriate data structure, in memory or in RAM. The map may be later used as an input to a spike correction algorithm as will be discussed in step S230. Based on the generated map, the algorithm, in step S215, determines whether each sample within k-space includes spike noise. If the determination in S215 is negative indicating that the sample is "not spike noise", the algorithm labels the sample as such so that no correction is performed on that sample in the spike correction step S230 described below. Instead that sample is used, in step S240, in image reconstruction as will be discussed below. If the determination in step S215 is positive indicating that the sample is classified as "spike noise", the algorithm identifies the location within k-space of the sample classified as spike noise and can mark. The marked samples are then input for spike correction processing as will be discussed below with respect to step S230.

Figure 2D:
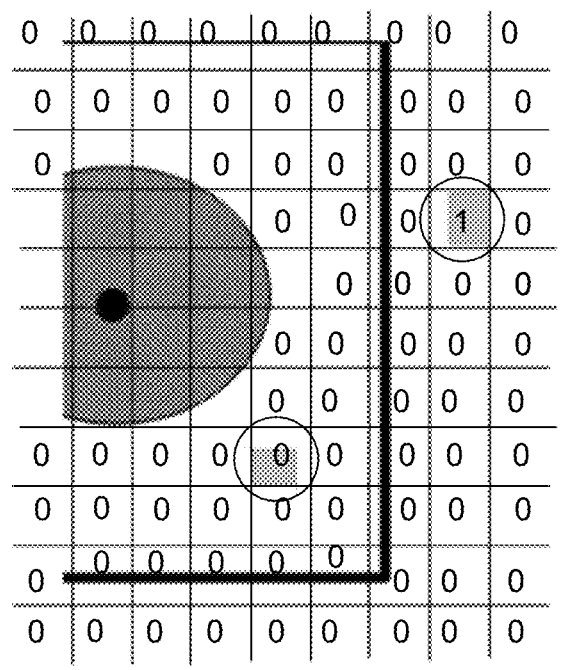

However, prior to spike correction being performed, in certain embodiments, step S220 is performed. In step S220, based on the generated map and location of spike noise within k-space, a determination is performed to ensure that the one or more samples in the generated map is correctable or should be corrected. This aspect of the algorithm considers the location of a sample indicated in step S215 as spike noise within k-space relative to the designed position of k=0. In other embodiments, the position of the sample relative to an edge of the region including the signal of interest 262 may be considered. In certain instances, the classifier may determine that, in view of the weights applied during spike detection by the trained model, the combination of the intensity of the sample and distance from k=0 causes the sample to be classified as "spike noise". However, the algorithm provides a further check to ensure that a sample classified as spike noise, but is within a predetermined distance in k-space from k=0, is not erroneously corrected. In other words, the algorithm ensures that data related to the signal of interest is not erroneously corrected. The following operation will be described again with reference to FIGS. 2B-2D. In one embodiment, where the k-space data is 2D data, a boundary (266 in FIG. 2B) may be created which has a predetermined sample height indicated by a distance labeled 268 in FIG. 2B and sample width indicated by a distance labeled 270 in FIG. 2B beyond k=0. This extends a predetermined sample distance in k-space beyond samples that are indicative of an edge of the region 262 which include the signal of interest. For example, the algorithm can have a predefined boundary where each boundary edge is a predetermined number of samples from k=0. The number of samples from k=0 may be 8 samples in each direction such that the boundary may be a "box" that is substantially 16×16 samples in height and width with k=0 being the center point of the box. The description of a boundary area being 16 samples by 16 samples around k=0 is merely exemplary and may have been derived based on empirical experience in MRI data acquisition. However, any number of sample distance from k=0 may be employed and set as a parameter of the algorithm being executed herein. In an embodiment where the k-space data is a plurality of slices representing 3D k-space data, the boundary may be represented as a sphere having a predetermined radial distance from k=0. The spherical boundary extends a predetermined sample distance beyond samples that are indicative of an edge of the region 262 including the signal of interest. In this embodiment, if the sample on the map generated above and shown in 2C indicates a position within the boundary region, the sample will not be corrected. Thus, sample 264*b* in FIG. 2C would not be corrected. Instead, the map would be updated as shown in FIG. 2D to change the value of sample 264*b* from "1" to "0". If the sample positioned in k-space outside the boundary 266 such as sample 264*a*, the sample will remain with a value of "1" indicating that it has been classified as spike noise and marked for correction in step S230.

If the determination in step S220 is positive, the algorithm proceeds to step S230 to perform spike correction using the map data generated above. If the determination in step S220 is negative, the algorithm may make a further determination, in step S225 as to whether the MR data needs to be reacquired. If the MR data needs to be reacquired, a reversion back to S200 occurs and the data from the patient is reacquired. In one example a positive result at S225 may occur if a sample within the boundary is identified as spike by the classifier. In another example, if the overall number of samples detected and identified as "spike noise" exceeds a predetermined acceptability threshold, reacquisition of the data may be requested. If the determination in step S225 is negative, the sample determined to be within the boundary 266 but not necessarily part of the signal of interest will be marked on the map as "not spike noise". This sample would not be corrected when the k-space data is processed using the spike correction algorithm in S230. This modification can once again be visualized when viewing FIGS. 2C and 2D. Step S220 may be useful in a case where the generated map of samples from S210 indicates that a sample is within a predetermined distance of k=0 (and samples indicative of an edge of the sample of interest in region 262) indicating that correction may be inappropriate and impact the signal of interest.

Continuing to step S230, using the generated map indicating the position of samples identified as spike noise, one or more spike noise correction algorithms may be applied. An exemplary spike correction technique is a zero-filling method where a value of the sample at locations with spikes is modified to be zero. This prevents the spike from causing a ripple in the image domain during image reconstruction. Zero-filling correction has a drawback in that some signal to noise (SNR) is lost but as is often the case, spikes are present proximate to the edges of k-space where the signal value of the samples is low or zero. Another spike correction technique is the nearest-neighbor method which uses data values of adjacent samples to modify (or direct copy) values from one or more samples adjacent to the sample mapped as spike noise.

Once the k-space data has been corrected as noted above, the algorithm proceeds to step S240 whereby image reconstruction of the k-space data is performed. In one embodiment, the image reconstruction step performs a Discrete Fourier Transform to reconstruct the raw k-space data acquired by the MRI system. The image is transformed into the image domain so that a diagnostic image can be generated and used in providing patient care. This manner of image reconstruction is merely exemplary. Any known image reconstruction algorithm which reconstructs k-space data into image domain data may be used. Once the image is reconstructed, the image may be output in step S250. The output may include displaying on a display screen/monitor in the MRI system. In another embodiment, the reconstructed image may be stored in memory and associated with the patient in patient database. In other embodiments, the reconstructed image can be communicated to remote computing devices.

The present disclosure focuses on the spike detection algorithm of step S210 because an improved spike detection mechanism provides a practical improvement in the resulting diagnostic image that is generated. As noted above, the genesis of spike noise comes from static charge. This charge is attributable to the many metal components of the MRI system which cause a current arc. The resulting arc is represented as spike noise in the acquired k-space data. For example, spike noise is regularly seen in EPI (echo planar imaging) scans that use rapidly oscillating readout gradient waveforms. The spike noise is dependent on the 'oscillation frequency' of the gradient waveforms. Rapidly oscillating gradients cause higher spike noise whereas slowly oscillating gradients cause lower spike noise. The operator-controlled parameter ETS (echo time spacing) controls the time between two consecutive echoes nominally acquired on the plateau of the oscillating gradients, and thus it controls the oscillation frequency. A higher ETS will cause lower spike noise and vice versa. Though higher ETS can cause other image artifacts such as increased distortion. As such, the ability to detect spike noise within k-space data acquired by an MR scanner would improve the resulting diagnostic image reconstructed therefrom while minimizing additional artifacts that result when a machine-control parameter is modified in hopes of minimizing spike noise. Thus, the spike detection algorithm described herein is fully integrated in an apparatus that captures MR data. This represents a practical application whereby raw MR data, which is not useful to the naked eye, is transformed into diagnostic image data that is reconstructed from k-space MR. In certain embodiments, information about the operator control parameters may be input to the classifier which can consider that information along with the intensity value and k-location of the sample when classifying the sample.

Figure 3A:
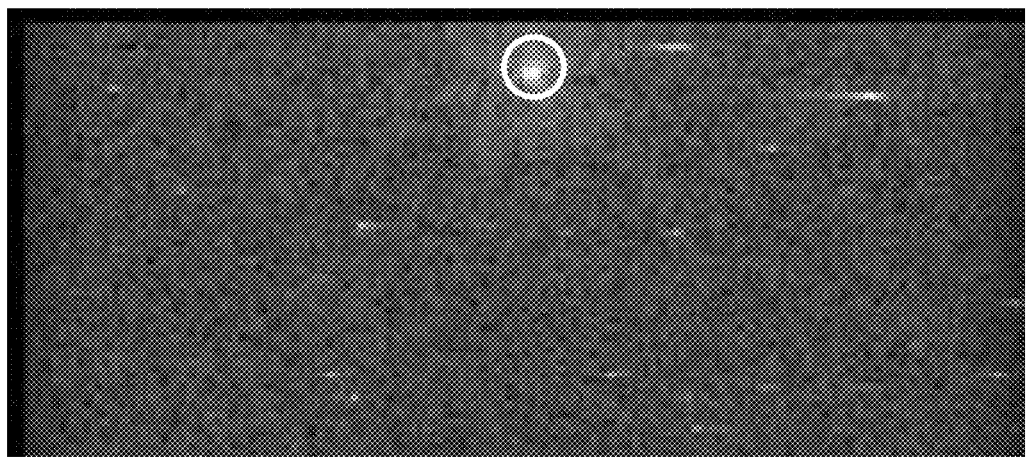
FIGS. 3A & 3B are exemplary data acquired by an MR scanner of FIG. 1.
Figure 3B:
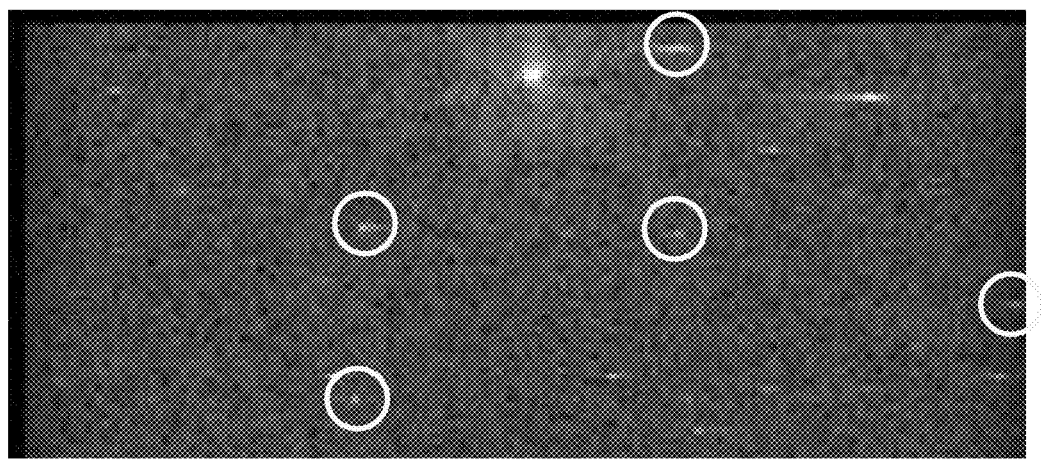
Figure 4:
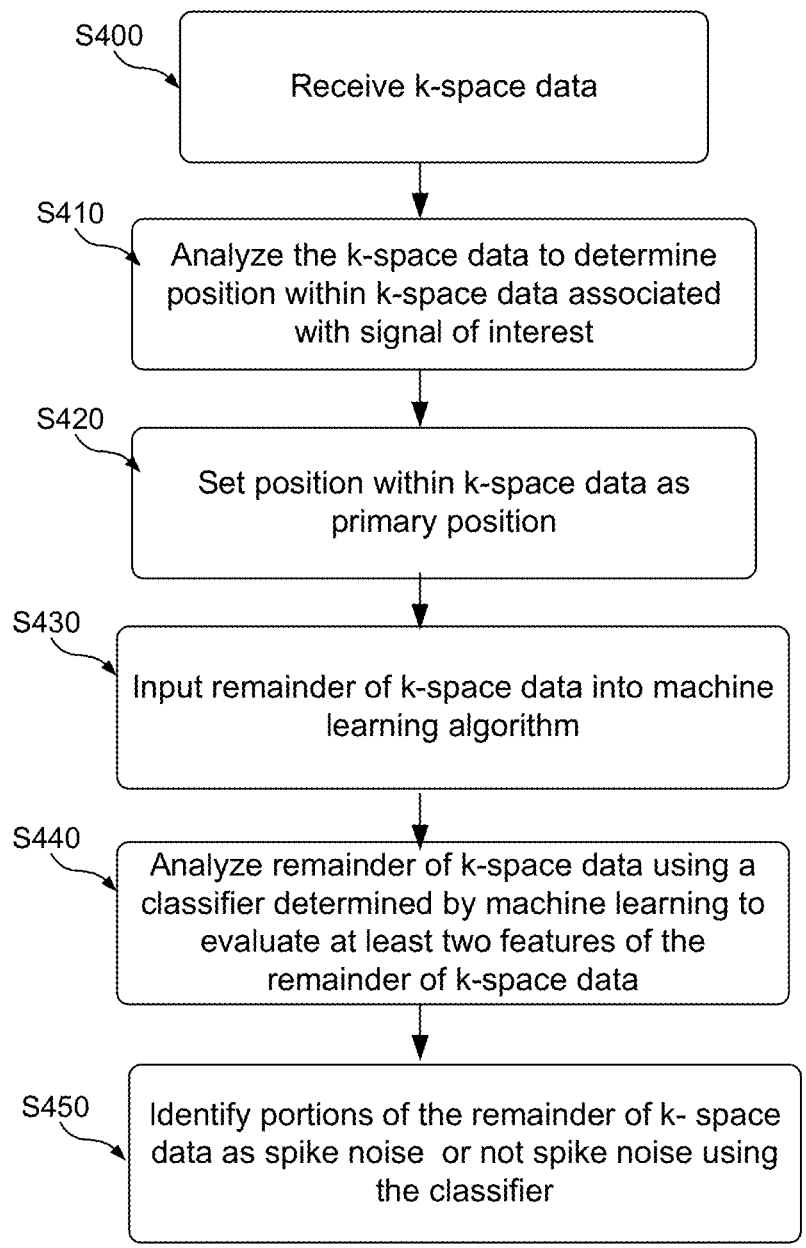
FIG. 4 is a flow diagram of an algorithm according to an embodiment.

By way of further example, FIGS. 3A and 3B illustrate additional k-space data acquired by the data acquisition step S200 using the MRI system of FIG. 1. As shown in FIG. 3A, the acquired k-space data includes a signal of interest contained within the circle in FIG. 3A. As shown herein, the signal of interest is formed from a plurality of individual samples within the acquired k-space data as set during the data acquisition process. The signal of interest represents a set of samples having the highest intensity relative to all other samples within k-space. Alternatively, the signal of interest can be based on the position of k=0 set during the data acquisition process. This is denoted by the algorithm as the signal of interest. A substantial center point thereof is marked on the sample map as k=0. By locating k=0 within k-space, a distance measurement can be performed on each of the other samples in k-space. This distance measurement identifies, for each other k-space sample, a distance that the sample is from k=0. As the distance of samples within k-space from k=0 is increased in a radial direction, the likelihood of samples containing signals of interest decreases and the likelihood that a sample with a high intensity value is spike noise increases. This is illustrated in FIG. 3B which shows the same k-space data as in FIG. 3A. Instead of circling the signal of interest (k=0), the k-space image identifies multiple positions within k-space that have an intensity level and k-location distance from k=0 determined by operation of a classifier to indicate that these samples in k-space are more likely to be spike noise samples. The operation of the classifier makes use of a model that has been trained by a machine learning algorithm. The trained model includes a plurality of layers each containing at least one node and the nodes consist of functions that input at least two parameters (intensity and k-location). The training process is based on a set of training data with known outcomes such that the model learns a set of coefficients (or weights) that are applied to the function at each respective node. When the k-space sample data is input to the trained model, a series of functions using the determined coefficients at each function are executed. The execution of the weighted function, at each node, through each layer of the trained model, operates to perform an operation similar to threshold processing. The trained model does not include a static singular threshold value against which information is compared. However, the execution of the series of weighted functions within the model allow for a similar process to occur. The result output by the model is a binary classification associated with each sample of k-space data as either "spike noise" (e.g. "1") or "not spike noise" (e.g. "0"). The coefficients applied to each function within the trained model are based on the features of at least intensity level and distance from k=0 and are heuristically determined during the training process. After the model has been trained and integrated into the spike detection algorithm, the trained model makes use of threshold processing which is function of both the intensity level of the sample and the k-distance of the sample. In other words, the trained model makes use of at least a first parameter representing sample intensity combined with a second parameter representing the location of the samples within k-space from k=0. The second parameter is known as the k-location of samples. This heuristically creates a signature that may be used as classifier in the trained model. The trained model automatically analyzes and detects the position of samples corresponding to this signature where the samples are at a k-location distance beyond k=0 which is greater than a heuristically determined distance, and have an intensity value greater than a heuristically determined intensity. It should be noted that, the circles in FIG. 3B are merely exemplary and it should not be understood that only samples in those circles represent spike noise. The spike noise detection algorithm advantageously analyzes each sample using the classifier signature to determine whether the particular sample within k-space is indicative of spike noise. It then dynamically generates a data object representing a map of the k-space data which maps the positions of each of the one or more samples representing the signals of interest and each sample (or set of samples) representing spike noise. FIG. 4 is a flow diagram detailing an exemplary spike detection algorithm according to an embodiment which is also performed by the MRI data processor 42 in FIG. 1. The algorithm starts at step S400 and receives as input k-space data acquired by magnetic resonance imaging scan sequence. The k-space data includes one or more samples of raw MR data acquired by the MRI system. In certain embodiments, the MR data acquired and input into the spike detection algorithm may have undergone some data preprocessing prior to being input into the spike detection algorithm. The input received in step S400 may represent information about each sample within the k-space data or it may be an input vector of the k-space data. In step S410, the k-space data is analyzed to detect a first characteristic of the k-space data and a position within k-space corresponding to the detected first characteristic. In one embodiment, the first characteristic corresponds to a signal of interest that will be transformed into a reconstructed image for diagnostic purposes. In one embodiment, step S410 may be performed by obtaining the MR scan control data which has set the location of k=0 prior to conducting the MR scan. In another embodiment, step S410 is performed by evaluating individual sample values over the entirety of the k-space data in order to identify one or more samples having the highest intensity value within k-space data which is indicative of a signal of interest. In step S420, the position determined in S410 is set to a primary location otherwise known as k=0. In step S430, the k-space data at locations other than the primary location are analyzed by using a trained model with a classifier. The classifier includes heuristically determined values associated with a first feature and second feature in order to classify all other samples at all positions within the k-space data other than the primary location as spike noise or not spike noise. In one embodiment, the first feature is a k-location of the sample which represents a distance, within k-space, that the particular sample being analyzed is away from the primary location. The second feature is an intensity value of the particular sample being evaluated. In step S440, the first and second features associated with each sample at positions other than the primary location are evaluated by the classifier to determine whether the particular sample is spike noise or not spike noise. The evaluation in S440 is akin to threshold processing. The trained model includes a plurality of layers each containing at least one node and the nodes that functions of the at least two parameters (intensity and k-location). A set of coefficients (or weights) are applied to the function at each respective node and, when the k-space data is input to the trained model, a series of functions using the determined coefficients are executed. This execution of the weighted function at each node is aggregated through each layer of the trained model operate to perform an operation similar to threshold processing as discussed above. The coefficients applied to each function within the trained model are based on the features of at least intensity level and distance from k=0. These features are heuristically determined during the training process prior to actual classification of k-space data. The trained model represents a series of small functions at each node and/or layer of the model. These are aggregated into a larger function of the first and second features. This aggregated function enables the classifier in the trained model to make a binary determination as to whether the particular k-space sample being evaluated is spike noise or not spike noise. This classification is based on the first and second feature values of the k-sample being evaluated. The determination for each sample is output into a data object representing a map of the k-space input in step S410 and identifies positions of all samples that, according to the classifier, are spike noise in step S450. In another embodiment, a more detailed map may be generated in step S450 which also maps the first position indicative of the signal of interest and positions of samples determined by the classifier to not be spike noise.

The above exemplary embodiments utilize neural network models (or a CNN model) to generate the classifier for performing binary classification of whether a data sample is spike noise or not. However, there are additional machine learning algorithms that may be trained in order to generate the classifier. In another exemplary embodiment the classifier outputs a probability indicating that a data sample is a spike noise. This can be done by adopting Softmax function at the output layer of the neural network. In this embodiment, the output of the classifier (output of the step S450) is a probability indicating that a data sample is a spike noise. After step S450, a further process is performed to determine whether the data sample is spike noise or not. This can be performed by adopting a predetermined threshold. If the probability is below the threshold the data sample is determined as 'not spike noise'. If the probability is equal to or above the threshold the sample is determined as 'spike noise'. The adaptive threshold based on features extracted from of the k-space data can also be adopted in this threshold processing. In combination, the classifier and the threshold processing performs a binary classification for determining whether each k-space data sample is spike noise or not. In other words, the algorithm of FIG. 4 should be understood to perform the following processing on MR data received from an MRI scanner. Processing includes obtaining k-space data of an object, acquired by a MRI scanner, including multiple data samples, wherein each data sample of the multiple data samples includes an intensity value. For each of the multiple data samples, a normalized intensity based on the intensity value and a distance value from an origin of the k-space data of the object is calculated and binary classification of whether a data sample of the multiple data sample represents noise or not noise is performed based on the intensity value of and the calculated distance value of the data sample. In doing so, there is detection processing, using the classifier to detect the spike noise based on the calculated normalized intensity value and calculated distance value. As discussed above, the binary classification is performed using a classifier trained by a machine learning algorithm in which a model is trained by inputting training data samples generated from k-space data, each training data sample including an intensity value and distance value from the origin of the k-space data.

The multiple data samples of k-space data that are obtained include a set of data samples that surround the origin forming a region containing a signal of interest and all of the multiple data samples are classified using a classifier that performs threshold processing that is a function based on the normalized intensity value and the distance of the respective sample from the origin. In a case that the threshold processing performed by the classifier determines that the data sample being classified has a normalized intensity value that is at least the normalized intensity value of one or more of the data samples within the region containing the signal of interest and is located at least at a first predetermined distance from the origin, the classifier classifies the sample as noise. In a case that the threshold processing determines that the sample has a normalized intensity value that is at least the normalized intensity value of one or more samples within the region containing the signal of interest and is located within the first predetermined distance from the origin, the classifier classifies the sample as not noise. In a case that the threshold processing performed determines that the sample has a normalized intensity value lower than one or more samples within the region containing the signal of interest and are located at least at a first predetermined distance from the origin, the classifier classifies the sample as the second type of sample.

In certain embodiments, the algorithm ensures that the identification of the data sample as spike noise that is to be corrected is a valid determination. More specifically, in response to determining, based on the classifier, that a particular data sample is noise, changing a designation of the particular data sample from noise to not noise based on the distance value indicating that particular data sample is within a second predetermined distance from the region containing signal of interest, the second predetermined distance being shorter than the first predetermined distance.

Upon completing spike detection processing on the obtained k-space data, a map of the data samples of the obtained data is generated such that the generated map identifies the a data sample at the origin and, based on the classification whether other data samples are noise or not noise. In certain embodiments, the generated map may be used in performing sample correction processing on data samples identified as noise to generate corrected data samples so that the data samples indicated as not noise and corrected sample data are transformed into processed image data for display on a display device.

An exemplary visualization and explanation of the algorithm in FIG. 4 will now be described with respect to FIGS. 5A and 5B. In FIG. 5A, the k-space data is labeled as "Uncorrected raw k-space". This is the data acquired from the MR imaging sequence and each sample in the k-space data is classified based on its k-space location and signal intensity. To classify whether the sample is spike noise, the sample intensity value is normalized and plotted against a distance from k=0. As can be seen in FIG. 5A, k=0 is labeled with reference numeral 502 on the plot adjacent to the k-space data. Sample values having a high intensity value and are at a predetermined k-distance from k=0 are likely to be spike noise. This is indicative of points labeled 504a-504c. Further, samples that do not have high intensity values and are within the predetermined k-distance are "not spike noise" and are points labeled 506a and 506b. It should be understood that only a subset of samples is illustrated in FIG. 5A. But in operation, classifications for each sample shown in the "Uncorrected raw k-space" would appear on a similar plot. Moreover, the plot and positions shown in FIG. 5A are not to scale and should be viewed in terms of the information they convey by their relative position on the plot of FIG. 5A. These features can be used in accordance with a training procedure discussed hereinafter to train a machine learning algorithm such as a neural network (NN) or a convolutional neural network (CNN). The machine learning algorithm will be trained to generate a classifier which will automatically output information about the position of spike data in an unknown k-space data sample input into the spike detection algorithm. The classifier generated by training the machine learning algorithm is visualized in the plot in FIG. 5B via the line labeled 508. Classifier boundary 508 can discriminate between samples that should be marked as "spike noise" and those that are "not spike noise". While illustrated as a line in FIG. 5B, the classifier is a series of weighted functions performed at nodes and layers within the trained model which operates as a thresholding process to make a binary classification about the particular k-space sample.

Figure 6A:
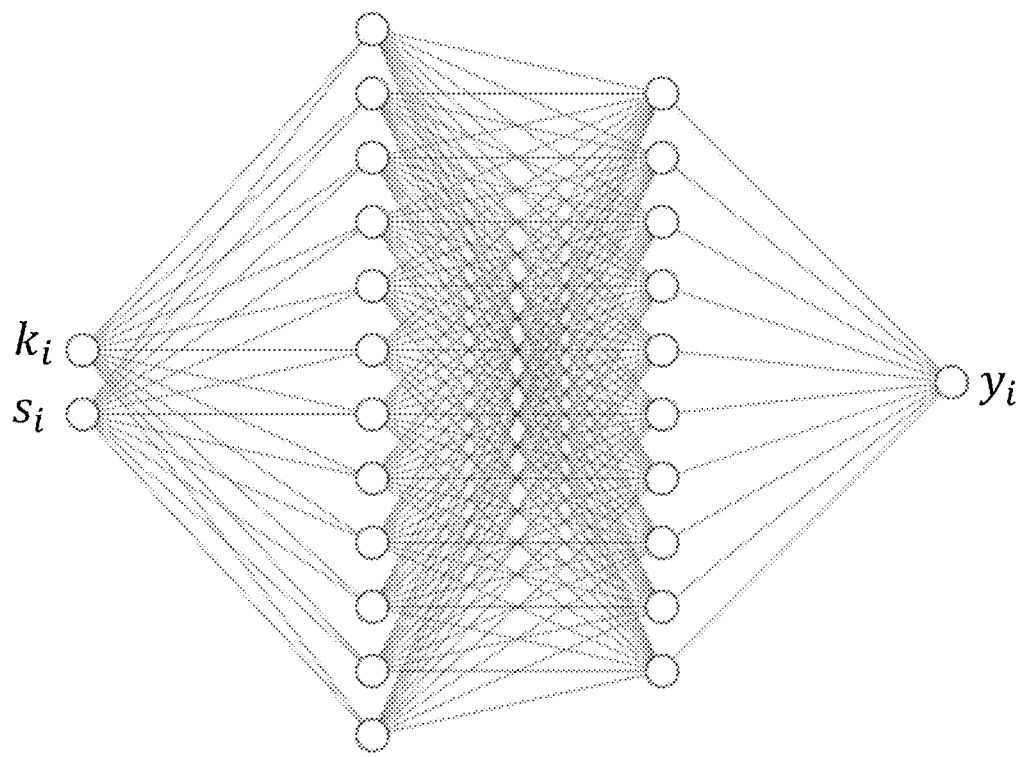
FIGS. 6A & 6B are exemplary machine learning models according to embodiments.

In order to obtain the classifier 508 shown in FIG. 5B, a machine learning algorithm will be trained to solve the binary spike classification problem associated with MR scan sequences such as EPI scans. An exemplary neural network to be trained is illustrated in FIG. 6. A set of training images or examples are defined and input into the neural network. For example, a k-space signal matrix having size [M, N] results in M×N number of training examples. In a case where the k-space matrix is a 256 sample by 256 sample matrix from 20 slices in 10 subjects, a potential set of substantially 13 million training pairs could be generated. In each of these training data sets, the location of the spikes in that data are explicitly known and used to generate the training labels. In operation, a given training pair is indexed by i and represented by $(\bar{x}_i, y_i)$. Where, the network input is $\bar{x}_i$: $\{k_i, s_i\}$, $k_i$ is the radial k-distance and $s_i$ is the normalized signal intensity and the network output $y_i$: $\{0,1\}$ where values 0 and 1 represent 'not spike' and 'spike', respectively. Training the neural network in this manner overcomes deficiencies associated with other mechanisms of spike detection. More specifically, because the genesis of spike noise is known but the location at which the spike noise appears in the k-space data captured by the MRI system is unknown, even random, using direct linear regression is not possible because the polynomial order typically used in a linear regression analysis is not known. This cannot be done manually or mentally due to the inherent randomness of the appearance of spike noise which would require an unreasonable level of time to process sample values for a plurality of k-space samples. The spike detection algorithm advantageously makes use of a neural network which has been trained in order to determine the correct boundary for the classifier based on at least two features of the samples in k-space.

Figure 6B:
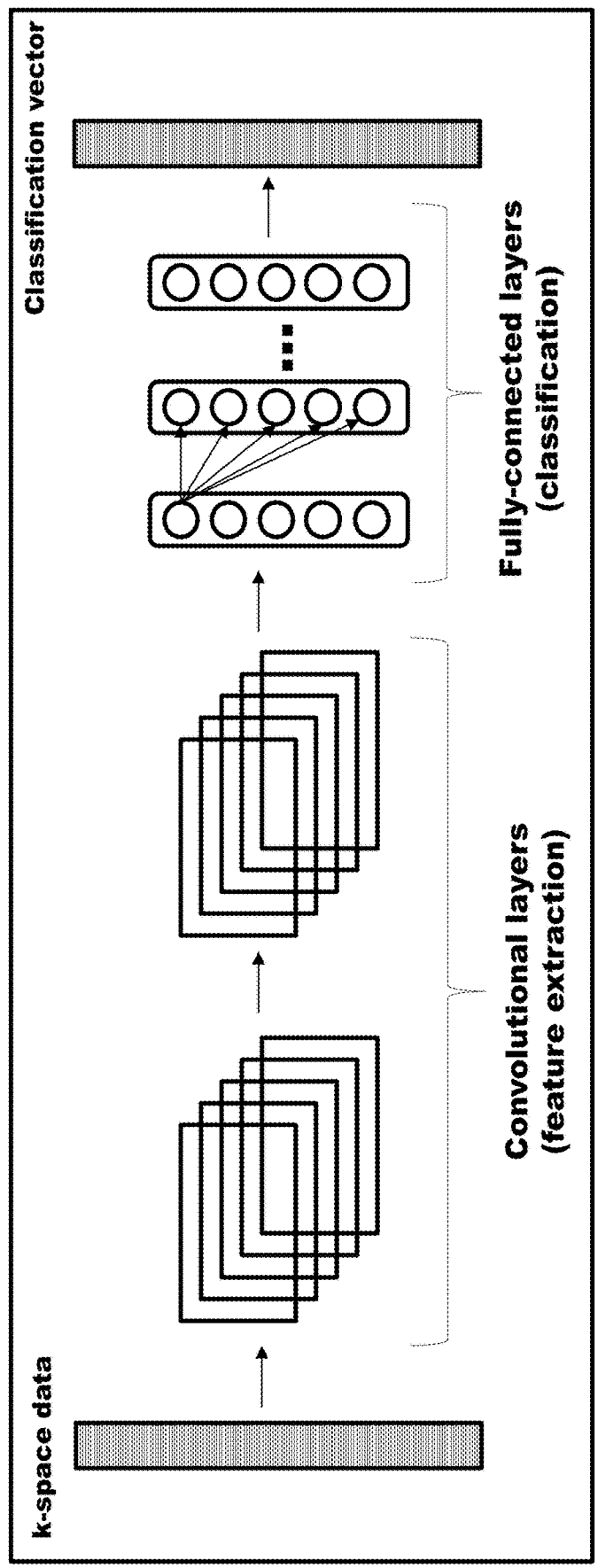

In another embodiment illustrated in FIG. 6B the machine learning algorithm employed in the spike detection algorithm is a CNN. In this embodiment, the entirety of the k-space data is input into the machine learning algorithm. This data is full complex-valued k-space data and is used to generate a binary classification vector to identify whether the particular samples are corrupted by spike data. The CNN includes a plurality of convolution layers which are the feature extraction layers to extract one or more features associated with the complex k-space data. The fully connected layers perform the classification to identify, for each sample, whether that sample is spike data.

In above-described exemplary embodiments the k-distance for a data sample of the k-space data is a distance between the data sample and the origin of the k-space data, which can be defined as a position where no spatial frequency information exists.

In certain of the above exemplary embodiments all of the k-space data samples other than the origin point (k=0) are input into the classifier in the step S430, in another exemplary embodiment all of the k-space data samples including the position of k=0 are input into the classifier in the step S430.

In the above exemplary embodiments the all of the k-space data samples other than the origin point (k=0) are input into the classifier in step S430. However, in another exemplary embodiment, the k-space data samples within the region of the signal of interest 620 are not input into the classifier, if the signal of interest is determined from the k-space data by the MRI data processor 42. This reduces the time spent in spike detection processing in the step S210 of FIG. 2A, by reducing the k-space data samples to be analyzed. In yet another exemplary embodiment, the k-space data samples within the boundary 266 are not input into the classifier in the step S430. This can also reduce the processing time for spike detection in FIG. 2A, by reducing the k-space data samples to be analyzed.

In some of the above exemplary embodiments, the trained classifier for spike noise detection has two input parameters which are an (normalized) intensity of a k-space data sample and the distance from the origin of the k-space. In another exemplary embodiment a classifier includes another input parameter. One example of the another input parameter is information of the MRI scan parameter. In this exemplary embodiment, if an MRI scan is performed in a radial scan mode, in a Cartesian scan mode or in a spiral scan mode, these information indicating a scan mode is also be an input of the classifier. Other various parameters related to a scan mode can also be inputs of the classifiers. Another example of the another input parameter is information of sequence controlling gradient magnetic field and pulse magnetic field. The above-described scan information and sequence information will be the same throughout the k-space data samples acquired in one MRI scan. If the scan and/or the sequence information is used as inputs of the classifier, this information will be included both in a training data set used in a training/learning phase and in data to be analyzed by the trained classifier in an inference phase illustrated in FIG. 2A and FIG. 4. In the inference phase, the scan information and sequence information can be obtained from the MRI system, prior to the step S200. Because generally scan modes and sequence information have effects on the k-space data and the image, including the scan information and/or sequence information as inputs of the classifier contributes to the detection sensitivity and specificity.

A representative training and testing algorithm for the machine learning algorithm is illustrated in FIGS. 7A and 7B, respectively. The goal of the training process is to learn the coefficients (weights and biases) of a NN/CNN model that can accurately classify k-space data samples as spike/no-spike. The ultimate structure of the network can be determined empirically by varying different static parameters at the outset of the training process such that results can be compared to identify which parameters and weights throughout the different layers yield the most predictive outcome for later use as a classifier. The NN/CNN is trained on a large set of training pairs $(\bar{x}_i, y_i)$. As such, a learning dataset associated with spike noise detection is acquired as shown in S702. The acquired training data is segmented, in S704, into training data and validation data. The training data will be augmented in S706 such that the machine learning algorithm can learn characteristics of spike noise that are different from those where actual training data (e.g. actual k-space MR data) is generated. In one example, data used to augment the training data may be clean k-space data that has been modified to digitally insert spikes having a random amplitude and be positioned randomly throughout the k-space data. This type of augmentation is preferable due to the nature of spike data sought to be identified due to spike noise being artificial in nature and originating from non-NMR sources. In S708, a training algorithm such as the stochastic gradient descent algorithm is selected for use. Thereafter, in S710 the structure and parameters of the model are set forth and a set of initial weights and biases for the nodes are assigned. The structure and parameters defined in S710 may include setting values representing a number of hidden layers, a number of nodes, a filter size, a learning rate, a number of epochs and a loss function. It should be understood that any of the above may be set individually or in conjunction with other such parameters and structures. Thereafter, in S712, training processing is performed to update weights and biases and validate the resulting classification via loss curve analysis. At S714, an evaluation is performed as to whether the loss curve and validation results are acceptable. If not, the S715 causes the structure and/or parameter values to be modified in order to attempt to bring the loss curve evaluation within a desired margin of error and the process reverts to S710 to re-define and/or otherwise modify structure and parameter values against which the training data set may be re-run. The training process is embodied in S710-S714 and may be performed using the following algorithmic operation. In this manner, $\bar{x}_i$ are the input variable ('k-location and intensity' for NN and full k-space data for CNN) and $y_i$ are the ground truth output values (a location has spike or not). During the training and testing process the k-space data will have to be normalized within a fixed range [newMin, newMax], otherwise the NN/CNN can be unstable. This can be achieved by applying a linear normalization to the original k-space data S such as $$S = (S - \text{Min})\frac{\text{newMax} - \text{newMin}}{\text{Max} - \text{Min}} + \text{newMin}$$

where, Min and Max are the minimum and maximum intensity values of the original k-space data and newMin and newMax are the minimum and maximum values of the normalized signal range.

The training seeks to minimize the training error which can be defined using a loss function. The loss function gives a quantitative measure of the difference between the ground-truth (spike/no-spike) and the prediction (probability of spike/no-spike). For example, cross-entropy loss function can be used to quantify the binary classification error and is given by:

$$-(y \log(p)+(1-y)\log(1-p))$$

where, y is the binary classification indicator, y=0 for 'no spike' and y=1 for 'spike'; p is the classification probability predicted by the NN/CNN. p=f (x, θ), that is p is a function of the input variables and the learned weights and biases represented by θ. During the training process, an algorithm such as stochastic gradient descent is utilized to minimize the loss function. Furthermore, the training employs ReLU as the activation function used in the NN/CNN nodes in order for the hidden layers to learn the non-linear relationships. It also uses Softmax in the output layer to convert the weights into probabilities so that these probabilities can be used to compute the cross-entropy loss as described earlier.

ReLU is given by: f (x)=max(x, 0), where x is the input to a given hidden node.

Softmax is given by:

$$f(x)_j = \frac{e^{x_j}}{\sum_{k=1}^{K} e^{x_k}}$$

where x is a vector of inputs to the output layer nodes indexed by j=1,2, ... K. Using the above, in the embodiment where the training is on a neural network, K=2, where training occurs for a binary classification NN. In the embodiment where the training is on a CNN, K=length of k-space vector when training is on full k-space data. At the conclusion of the training a set of optimal parameters (weights and biases) are obtained which have been shown to produce the lowest loss values for the training and validation dataset. These network parameters are the classifier and can be output to a data file and loaded into memory when testing a set of unlabeled data in S716.

The result of the training process discussed above generates a classifier that is well-generalized such that when implemented in the spike detection algorithm on new, non-training k-space MR data, the algorithm can identify the location of samples within the k-space that are corrupted by spike noise. This identification process is used to generate a spike data map which can be provided, along with the acquired k-space MR data to a spike correction algorithm, to correct the corrupted k-space prior to generating a diagnostic image. This can be empirically tested in FIG. 7B whereby the acquired learning dataset which was segmented into training set data and validation data can be acquired in S720 such that images from the validation set representing unclassified k-space data can be input, S722, into the trained machine learning algorithm that uses the classifier output from S716 in FIG. 7A for inspection in S724.

The trained classifier can be updated by adding more training data sets and performing the training of the model with the added training data set in addition to the original training data set. For the additional training data set, k-space data having been subjected to the spike detection with the original classifier can be used. In order to use the k-space data as a training data set, label information, indicating a spike noise or not, should be added for each sample of the k-space data, and authorized/confirmed by a specialist. If the newly-trained classifier has better sensitivity and specificity, the updated classifier will replace the original one. If the original classifier is locally stored in a memory in the MRI system, the service person can connect a removable media (a USB stick memory or an SD card) to the MRI system and transfers the newly-trained classifier stored in the removable media to the memory in the MRI system. If the original classifier is stored in a server external to the MRI scanner, the service person uploads the newly-trained classifier to the server so that the server can performs the spike detection using the uploaded, newly-trained classifier.

The above exemplary embodiments utilize a neural network and a convolutional neural network as models to be trained. In another exemplary embodiments other types of neural networks including a recurrent neural network, a stochastic neural network, can also be utilized as models to be trained for generating classifiers for spike noise detection. Also, in yet other embodiments, other types of models including a Support Vector Machine can be used to generate classifier. In the Support Vector Machine (SVM) the two parameters including the (normalized) intensity values and the k-distance can also be used with other types of feature values as input feature values of the SVM.

In another exemplary embodiment, multiple trained classifiers can be prepared by the machine learning algorithm described with reference to FIGS. 7A and 7B. If scan information is used for spike noise detection, a classifier can be prepared for each scan mode. For example, a first classifier is for detecting a spike noise from k-space data acquired in a radial scan mode, a second classifier is for detecting a spike noise from k-space data acquired in a Cartesian scan mode, a third classifier is for detecting a spike noise from k-space data acquired in a spiral scan mode. In a training/learning phase, each of the first, second and third classifier can be trained as describe above with reference to FIGS. 7A and 7B, but the training data set used for each classifier is a training data set acquired in a specific corresponding scan mode. In an inference phase described with reference to FIG. 2A and FIG. 4, prior to the step S210, the MRI data processor 42 obtains from the MRI system the scan mode used in acquiring the k-space data in the step S200 and selects a classifier from the first, second and the third classifiers. If the used scan mode is the radial scan mode the first classifier is selected, if the used scan mode is the Cartesian scan mode the second classifier is selected, and if the used scan mode is the spiral scan mode the third classifier is selected. The selected classifier will be used in the step S210 for spike detection.

In yet another embodiment of preparing multiple classifiers, the MRI system stores a fourth classifier receiving both the scan information and the sequence information in addition to the (normalized) intensity and the k-distance, a fifth classifier receiving the scan information in addition to the (normalized) intensity and the k-distance but not receiving the sequence information, and a sixth classifier receiving the sequence information in addition to the (normalized) intensity and the k-distance but not receiving the scan information. A service person or an operator of the MRI system can select either one of the fourth, the fifth and the sixth classifier for spike detection. The MRI system may also allow the service person or the operator to select either the fourth classifier, the fifth classifier, the sixth classifier or a set of the first, second, and the third classifiers.

Figure 8:
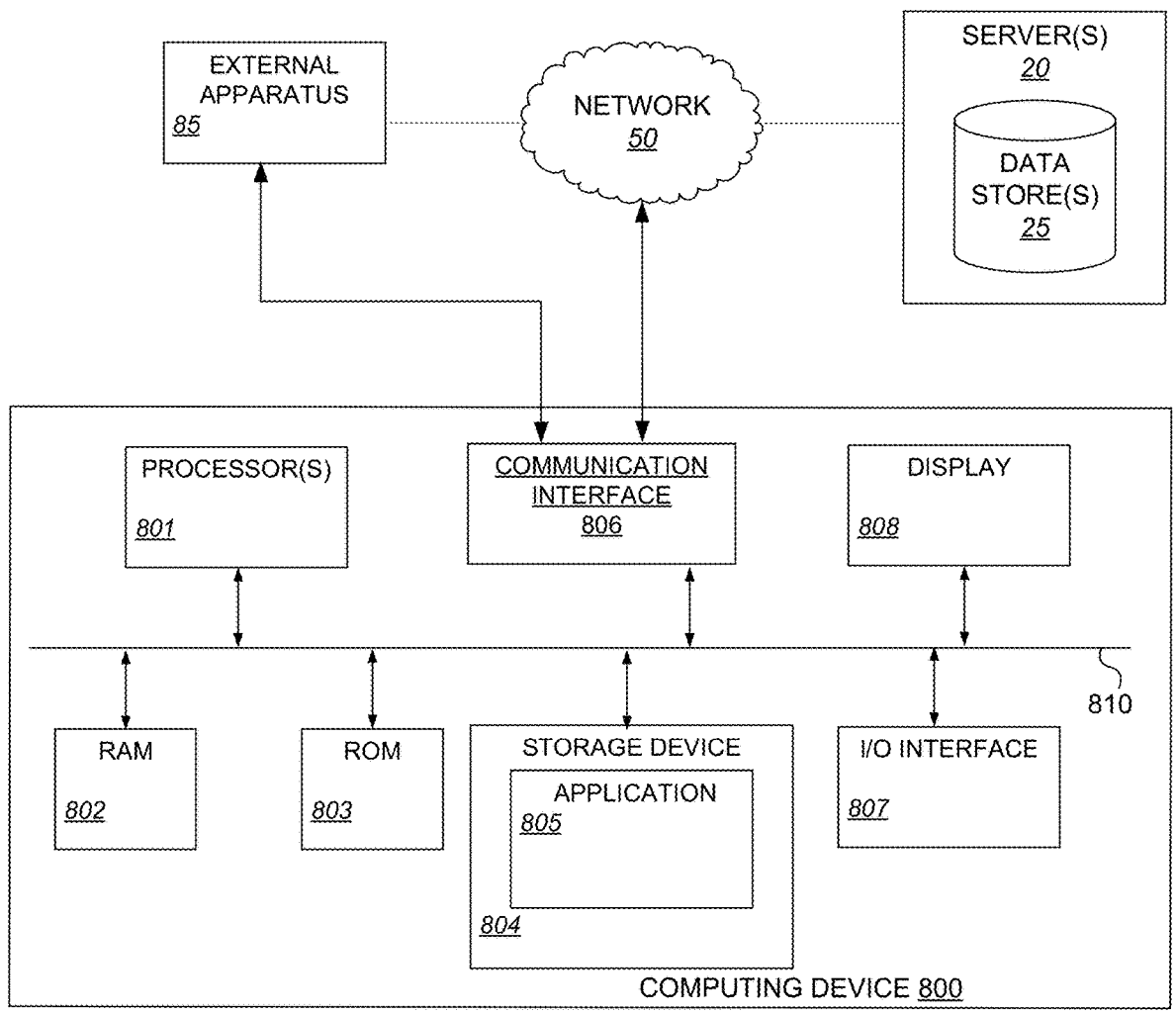
FIG. 8 is a block diagram of a computing system according to an embodiment.

The training algorithm described in FIGS. 7A & 7B is performed on a computing device such as is shown in FIG. 8. The computing device 800 illustrates an example of a device that can perform one or more of the algorithms described hereinabove. In one embodiment, the computing device can perform the training of the model which yields the classifier as discussed above in FIGS. 7A and 7B. In another embodiment, the computing device can perform the spike detection algorithm described in FIGS. 2 and/or 4. In a further embodiment, the computing device 800 may perform both the training algorithm and spike detection algorithm described hereinabove. The computing device 800 includes a processing unit 801, system memory including random access memory (RAM) 802 and read only memory (ROM) 803, a storage device 804 storing various programs and data, a communication interface 806, an input/output (I/O) interface 807, and a display 808 all connected by a bus 810. As shown herein, the computing device 800 may be connected, via a network 50, to one or more external apparatus(s) 85 and/or server(s) 20 having one or more data stores 25 that store image data that may (a) be used for training a model using a machine learning algorithm, (b) verifying the success of the trained model, and (c) use the stored date to determine if the stored data contains spike noise using the spike detection algorithm according to the disclosed embodiments. This listing is intended to be read as any of (a), (b) and (c) individually, together or in any combination with one another.

The computing device 800 is an example of a computing system. The term computing system as used herein includes but is not limited to one or more software modules, one or more hardware modules, one or more firmware modules, or combinations thereof, that work together to perform operations on electronic data. The physical layout of the modules may vary. A computing system may include multiple computing devices coupled via a network. A computing system may include a single computing device where internal modules (such as a memory and processor) work together to perform operations on electronic data. Also, the term resource as used herein includes but is not limited to an object that can be processed at a computing system. A resource can be a portion of executable instructions or data.

The processing unit 801 may comprise a single central-processing unit (CPU) or a plurality of processing units. The processing unit 801 executes various processes and controls the computing device 800 in accordance with various programs stored in memory. The processing unit 801 controls reading data and control signals into or out of memory. The processing unit 801 uses the RAM 802 as a work area and executes programs stored in the ROM 803 and the Storage Device 804. In some embodiments, the processor(s) 801 include one or more processors in addition to the CPU. By way of example, the processor(s) 801 may include one or more general-purpose microprocessor(s), application-specific microprocessor(s), and/or special purpose microprocessor(s). Additionally, in some embodiments the processor(s) 801 may include one or more internal caches for data or instructions.

The processor(s) 801 provide the processing capability required to execute an operating system, application programs, and various other functions provided on the computing device 800. The processor(s) 801 perform or cause components of the computing device 800 to perform various operations and processes described herein, in accordance with instructions stored in one or more memory devices 803 and 804 while using the capability of the work area memory RAM 802.

The RAM 802 is used as a work area during execution of various processes, including when various programs stored in the ROM 803 and/or the Storage Device 804 are executed. The RAM 802 is used as a temporary storage area for various data. In some embodiments, the RAM 802 is used as a cache memory.

The ROM 803 stores data and programs having computer-executable instructions for execution by the processing unit 801. The ROM 803 stores programs configured to cause the computing device 800 to execute various operations and processes. In one embodiment, the ROM 803 has stored therein an operating system that includes one or more programs and data for managing hardware and software components of the computing device 800. The ROM 803 and storage device 804 may further store one or more applications that utilize or otherwise work in conjunction with the operating system in executing various operations.

The Storage Device 804 stores application data, program modules and other information. Some programs and/or program modules stored in the Storage Device 804 are configured to cause various operations and processes described herein to be executed. The Storage Device 804 may be, for example, a hard disk or other non-transitory computer-readable storage medium. The Storage Device 804 may store, for example, an operating system. As shown herein, the storage device 804 stores an application 805 that can be selectively executed to perform model training and/or verification used to generate the trained model and classifier for use in the spike detection algorithm. In other embodiments, the application may include the spike detection algorithm described in FIGS. 2 and 4. It should be noted that the term application may include one or more programs comprising a set of one or more instructions and/or algorithms to be executed by one or more processing units to achieve a desired processing result.

A communication interface 806 may include hardware and software for establishing and facilitating unidirectional and/or bidirectional communication between the computing device 800 and one or more external apparatus(s) 85 and servers 20. The communication interface 806 may include a network interface including hardware, software, or both providing one or more interfaces for communication (such as, for example, packet-based communication) between the computing device 800 and one or more external apparatuses and/or servers 20 on the network 50. As an example and not by way of limitation, a network interface may include a network interface card (NIC) or a network controller for communicating with an Ethernet or other wire-based network or a wireless NIC (WNIC) or wireless adapter for communicating with a wireless network, such as a WI-FI network. This disclosure contemplates any suitable network 50 and any suitable network interface for it. As an example and not by way of limitation, the computing device 800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks 810 may be wired or wireless.

The communication interface 806 may also include one or more mechanisms for establishing direct connection between an external apparatus and the computing device 800 using one or more short distance communication protocols. One exemplary type of short distance communication protocol may include Near Field Communication (NFC) that enables bidirectional communication with a mobile computing device having NFC functionality. This may be provided by an NFC unit which includes circuitry and software that enables transmission (writes) and reception (reads) of commands and data with a non-contact type device using a short distance wireless communication technique such as NFC (Near Field Communication; ISO/IEC IS 18092). In other embodiments, the communication interface may also communicate according to the BLUETOOTH communication standard by including a transceiver capable of transmitting and receiving data via short wavelength radio waves ranging in frequency between 2.4 GHz and 2.485 GHz. In other instances, the communication interface 806 may also include an infrared (IR) unit that can emit and sense electromagnetic wavelengths of a predetermined frequency have data encoded therein. Furthermore, while not specifically shown, the short distance communication interface may also include a smart card reader, radio-frequency identification (RFID) reader, device for detecting biometric information, a keyboard, keypad, sensor(s), a combination of two or more of these, or other suitable devices.

The computing device 800 includes an input/output (I/O) interface 807 that includes one or more ports for connecting external devices used for entering information and/or instructions as inputs for controlling one or more operations of the computing device 800. The I/O interface 807 may, for example, include one or more input/output (I/O) port(s) including, but not limited to, a universal serial bus (USB) port, FireWire port (IEEE-1394), serial port, parallel port, HDMI port, thunderbolt port, display port and/or AC/DC power connection port. When connected to a respective port of the I/O interface 807, one or more external device(s) 808 to communicate with the computing device 800 to one or provide input to or receive output from the computing device 800. As an example and not by way of limitation, an I/O device may include a keyboard, keypad, microphone, monitor, mouse, speaker, still camera, stylus, tablet, touch screen, trackball, video camera, another suitable I/O device or a combination of two or more of these. An I/O device may include one or more sensors. In some embodiments, the I/O interface 807 includes one or more device or software drivers enabling the processor(s) 807 to drive one or more of these I/O devices.

The computing device 800 may also include a display 808 that is configured to output one or more display screens generated by one or more applications executing on the computing device 800. The display 808 may be any type of display device including but not limited to a liquid crystal display (LCD), light emitting diode (LED) display, organic light emitting diode (OLED) display and the like. Further, while the display 808 is shown as part of the computing device 800, it should be understood that this is not required and instead, the display 808 may be selectively connected to the computing device 800 via the I/O interface 807 such that the display 808 is external from the computing device 800. It should also be understood that the display 808 on which output generated by the computing device 800 is to be displayed may be present in one or more external apparatus (s)/servers connected to the computing device 800 either via the network 50 or direct wireless communication such as WWI direct or the like.

The system bus 810 interconnects various components of the computing device 800 thereby enabling the transmission of data and execution of various processes. The system bus 810 may include one or more types of bus structures including a memory bus or memory controller, a peripheral bus, and a local bus using any of a variety of bus architectures.

As set forth above, the algorithms of the present disclosure and the hardware that is configured to execute those algorithms, recites, in one embodiment, an image processing apparatus is provided and includes one or more memories storing instructions and one or more processors that execute the instructions and are configured to obtain data captured by an image capturing apparatus, including a plurality of data samples each having respective intensity values associated therewith, wherein a set of data samples that surround a first data sample at a designated position forms a region containing a signal of interest. The apparatus classifies data samples using a classifier that performs threshold processing that is a function based on intensity value and a position of the sample within the obtained data. In a case that the threshold processing determines, based on the intensity of the sample and that the sample being located at least at a predetermined distance from the designated position, the classifier classifies the sample as a first type of sample. In a case that the threshold processing determines, based on the intensity of the sample that the sample and that the sample being located within the predetermined distance from the designated position, the classifier classifies the sample as a second type of sample.

In another embodiment, the present disclosure provides an image processing apparatus is provided and includes one or more memories storing instructions and one or more processors that execute the instructions and are configured to obtain, from an image capturing apparatus, data including a plurality of data samples, wherein a first a data sample is at a designated position and has a value associated with a first parameter that is higher than first parameter values for all other of the plurality of data samples and a set of data samples that surround the first data sample forming a region containing a signal of interest, each of the data samples in the set of data samples having first parameter values less than the first data sample but greater than other data samples not within the region. The apparatus classifies data samples other than those in the region including the signal of interest using a classifier that performs threshold processing that is a function of the first parameter values and a second parameter identifying a position of the sample within the obtained data. In case that the threshold processing determines that the sample has a first parameter value that is at least the first parameter value of samples within the region containing the signal of interest and are located at least at a first predetermined distance from the designated position, the classifying the sample as a first type of sample. In a case that the threshold processing determines that the sample has a first parameter value that is at least the first parameter value of samples within the region of interest and are located within the first predetermined distance from the designated position, classifying the sample as a second type of sample.

In another embodiment, the present disclosure provides an image processing apparatus which is provided and includes one or more memories storing instructions and one or more processors that execute the instructions and are configured to obtain, from an image capturing apparatus, data including a plurality of data samples, wherein a first a data sample is at a designated position and has an intensity value higher an intensity value for all other of the plurality of data samples and a set of data samples that surround the first data sample forming a region containing a signal of interest, each of the data samples in the set of data samples having an intensity value less than the first data sample but greater than other data samples not within the region. The apparatus is further configured to classify data samples other than those in the region including the signal of interest using a classifier that performs threshold processing that is a function of the intensity value for the sample and a position of the sample within the obtained data. In case that the threshold processing performed by the classifier indicates that the sample has an intensity value substantially similar to intensity values within the region of interest and are located at least at a first predetermined distance from the designated position, the sample is classified as a first type of sample. In case that the threshold processing performed by the classifier indicates that the sample has an intensity value substantially similar to intensity values within the region of interest and are located within the first predetermined distance from the designated position, the sample is classified as a second type of sample.

In another embodiment, the present disclosure provides an image processing apparatus for detecting spike noise is provided and includes one or more memories storing instructions and one or more processors configured to execute the stored instructions to obtain k-space data of an object, which is acquired by an image capturing apparatus, including multiple data samples, wherein each data sample of the multiple data samples have an intensity value. The apparatus calculates, for each data sample, a distance value from an origin of the k-space data of the object and determines if a data sample of the multiple data sample is a spike noise using a classifier for detecting spike noise based on the intensity value and the calculated distance value. The classifier is trained by a machine learning algorithm in which a model is trained by inputting training data samples generated from k-space data such that the training data samples includes intensity values and distance values from the origin of the k-space data. At least one of the training data samples further includes label information indicating the at least one of the training data samples is a spike noise.

A further embodiment provided by the present disclosure includes an image processing apparatus for detecting spike noise. The image processing apparatus includes one or more memories storing instructions and one or more processors configured to execute the stored instructions to obtain k-space data of an object, which is acquired by an MRI scanner, including multiple data samples and each data sample of the multiple data samples having an intensity value. The apparatus calculates, for each of multiple data samples, a normalized intensity based on the intensity value and a distance value from an origin of the k-space data of the object and performs a binary classification of whether a data sample of the multiple data sample is a spike noise or not, based on the intensity value of and the calculated distance value of the data sample.

Unless otherwise noted, the various embodiments described hereinabove are understood to be compatible with one another and one or more individual aspects of the various embodiments can be combined with others of the various embodiments to implement and execute the features described herein.

Additionally, the computing system may include other storage media, such as non-volatile flash memory, removable memory, such as a compact disk (CD), digital versatile disk (DVD), a CD-ROM, memory card, magneto-optical disk or any combination thereof. All or a portion of a computer-readable storage medium of the computing system may be in the form of one or more removable blocks, modules, or chips. The computer-readable storage medium need not be one physical memory device, but can include one or more separate memory devices.

In referring to the description, specific details are set forth in order to provide a thorough understanding of the examples disclosed. In other instances, well-known methods, procedures, components, and circuits have not been described in detail as not to unnecessarily lengthen the present disclosure.

It should be understood that if an element or part is referred herein as being "on", "against", "connected to", or "coupled to" another element or part, then it may be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90° or at other orientations) and the spatially relative descriptors used herein are to be interpreted accordingly. Similarly, the relative spatial terms "proximal" and "distal" may also be interchangeable, where applicable.

The term "about," as used herein means, for example, within 10%, within 5%, or less. In some embodiments, the term "about" may mean within measurement error.

The terms first, second, third, etc. may be used herein to describe various elements, components, regions, parts and/or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated.

The foregoing merely illustrates the principles of the disclosure. Various modifications and alterations to the described exemplary embodiments will be apparent to those skilled in the art in view of the teachings herein.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

We claim:

1. An image processing apparatus comprising:
one or more memories storing instructions; and
one or more processors configured to execute the stored instructions to:
obtain k-space data of an object, acquired by a MRI scanner, including multiple data samples, wherein each data sample of the multiple data samples includes an intensity value;
calculate, for each of multiple data samples, a distance value from an origin of the k-space data of the object; and
perform a classification of whether a data sample of the multiple data sample represents spike noise, based on the intensity value of and the calculated distance value of the data sample.

2. The image processing apparatus according to claim 1, wherein the classification is performed using a classifier trained by a machine learning algorithm in which a model is trained by inputting training data samples generated from k-space data, each training data sample including an intensity value and distance value from the origin of the k-space data of each training data sample.

3. The image processing apparatus of claim 2, wherein execution of the instructions further configures the one or more processors to calculate, for each of multiple data samples, a normalized intensity from the obtained intensity value and perform classification using the normalized intensity value.

4. The image processing apparatus according to claim 2, wherein the classifier is a model trained by a machine learning algorithm using a set of signal data generated by the MRI scanner including a number of data samples labeled as spike noise and a set of signal data generated by the MRI scanner having data samples that have been modified to be and labeled as spike noise.

5. The image processing apparatus of claim 1, wherein the obtained multiple data samples include a set of data samples that surround the origin forming a region, and
wherein the classification is performed by classifying all of the multiple data samples using a classifier that performs threshold processing that is a function based on a normalized intensity value and the distance of the respective sample from the origin.

6. The image processing apparatus of claim 5, wherein
in a case that the threshold processing performed by the classifier determines that the data sample being classified has a normalized intensity value that is at least the normalized intensity value of one or more of the data samples within the region and is located at a distance from the origin that is equal to or greater than a first predetermined distance, the classifier classifies the sample as spike noise,
in a case that the threshold processing determines that the sample has a normalized intensity value that is at least the normalized intensity value of one or more samples within the region and is located at a distance from the origin less than the first predetermined, the classifier classifies the sample as not spike noise; and
in a case that the threshold processing performed determines that the sample has a normalized intensity value lower than one or more samples within the region and are located at a distance from the origin equal to or greater than the first predetermined distance, the classifier classifies the sample as not spike noise.

7. The image processing apparatus according to claim 6, wherein execution of the instructions further configures the one or more processors to
in response to determining, based on the classifier, that a particular data sample is spike noise, changing a designation of the particular data sample from spike noise to not spike noise based on the distance value indicating that particular data sample is within a second predetermined distance from the region, the second predetermined distance being shorter than the first predetermined distance.

8. The image processing apparatus according to claim 1, wherein execution of the instructions further configures the one or more processors to:
generate a map of the data samples of the obtained data such that the generated map identifies the data sample at the origin and, based on the classification, whether other data samples are spike noise or not spike noise.

9. The image processing apparatus according to claim 1, wherein execution of the instructions further configures the one or more processors to:
perform sample correction processing on data samples identified as noise to generate corrected data samples; and
transform the data samples indicated as not spike noise and corrected sample data into processed image data for display on a display device.

10. An image processing method comprising:
obtaining k-space data of an object, acquired by a MRI scanner, including multiple data samples, wherein each data sample of the multiple data samples includes an intensity value;
calculating, for each of the multiple data samples, a distance value from an origin of the k-space data of the object; and
performing a classification of whether a data sample of the multiple data sample represents noise, based on the intensity value of and the calculated distance value of the data sample.

11. The image processing method according to claim 10, wherein performing binary classification further comprises
using a classifier trained by a machine learning algorithm in which a model is trained by inputting training data samples generated from k-space data, each training data sample including an intensity value and distance value from the origin of the k-space data of each training data sample.

12. The image processing method of claim 11, further comprising:
detecting, using the classifier, spike noise based on a calculated normalized intensity value and the calculated distance value.

13. The image processing apparatus according to claim 11, wherein the classifier is a model trained by a machine learning algorithm using a set of signal data generated by the MRI scanner including a number of data samples labeled as spike noise and a set of signal data generated by the MRI scanner having data samples that have been modified to be and labeled as spike noise.

14. The image processing method of claim 10, wherein the obtained multiple data samples include a set of data samples that surround the origin forming a region, and further comprising:
classifying all of the multiple data samples using a classifier that performs threshold processing that is a function based on the normalized intensity value and the distance of the respective sample from the origin.

15. The image processing method of claim 14, wherein
in a case that the threshold processing performed by the classifier determines that the data sample being classified has a normalized intensity value that is at least the normalized intensity value of one or more of the data samples within the region and is located at a distance from the origin equal to or greater than a first predetermined distance, the classifier classifies the sample as spike noise,
in a case that the threshold processing determines that the sample has a normalized intensity value that is at least the normalized intensity value of one or more samples within the region and is located at a distance from the origin less than the first predetermined, the classifier classifies the sample as not spike noise; and
in a case that the threshold processing performed determines that the sample has a normalized intensity value lower than one or more samples within the region and are located a distance from the origin equal to or greater than a first predetermined distance, the classifier classifies the sample as not spike noise.

16. The image processing method according to claim 15, further comprising:
in response to determining, based on the classifier, that a particular data sample is spike noise, changing a designation of the particular data sample from spike noise to not spike noise based on the distance value indicating that particular data sample is within a second predetermined distance from the region containing signal of interest, the second predetermined distance being shorter than the first predetermined distance.

17. The image processing method according to claim 10, further comprising:
generating a map of the data samples of the obtained data such that the generated map identifies the a data sample at the origin and, based on the classification, whether other data samples are spike noise or not spike noise.

18. The image processing method according to claim 10, further comprising:
performing sample correction processing on data samples identified as spike noise to generate corrected data samples; and transforming the data samples indicated as not spike noise and corrected sample data into processed image data for display on a display device.

19. An image processing apparatus comprising:

one or more memories storing instructions; and one or more processors that execute the instructions and are configured to obtain k-space data captured by a MRI scanner, including a plurality of data samples each having respective intensity values associated therewith, wherein a set of data samples that surround a first data sample at a designated position forms a region containing a signal of interest;

classifying data samples using a classifier that performs threshold processing that is a function based on intensity value and a position of the sample within the obtained k-space data, in a case that the threshold processing determines, based on the intensity of the sample being located at least at a predetermined distance from the designated position in the k-space, the classifier classifies the sample as a first type of sample, and in a case that the threshold processing determines, based on the intensity of the sample being located within the predetermined distance from the designated position in the k-space, the classifier classifies the sample as a second type of sample.

* * * * *